(12) United States Patent
Hierold et al.

(10) Patent No.: US 7,754,608 B2
(45) Date of Patent: Jul. 13, 2010

(54) MANUFACTURING METHOD FOR THE INTEGRATION OF NANOSTRUCTURES INTO MICROCHIPS

(75) Inventors: Christofer Hierold, Baden (CH); Christoph Stampfer, Völs am Schlern (IT); Alain Jungen, Kahler (LU)

(73) Assignee: ETH Zürich, Zürich (CH)

( * ) Notice: Subject to any disclaimer, the term of this patent is extended or adjusted under 35 U.S.C. 154(b) by 113 days.

(21) Appl. No.: 11/915,537

(22) PCT Filed: May 26, 2005

(86) PCT No.: PCT/EP2005/005690

§ 371 (c)(1),
(2), (4) Date: Jul. 15, 2008

(87) PCT Pub. No.: WO2006/125457

PCT Pub. Date: Nov. 30, 2006

(65) Prior Publication Data

US 2008/0308786 A1 Dec. 18, 2008

(51) Int. Cl.
*H01L 21/44* (2006.01)
(52) U.S. Cl. .................. 438/680; 257/20; 257/536; 977/891
(58) Field of Classification Search ............... 257/20, 257/536; 205/103; 209/127.1; 438/680
See application file for complete search history.

(56) References Cited

U.S. PATENT DOCUMENTS

| 6,350,363 | B1 * | 2/2002 | Bradley ................ 205/103 |
| 7,161,107 | B2 * | 1/2007 | Krupke et al. ......... 209/127.1 |
| 2005/0062034 | A1 * | 3/2005 | Dubin .................. 257/20 |
| 2005/0253220 | A1 * | 11/2005 | Lin et al. .............. 257/536 |

FOREIGN PATENT DOCUMENTS

WO   WO2005/065425 A2   7/2005

OTHER PUBLICATIONS

Englander et al., "Local synthesis of silicon nanowires and carbon nanotubes on microbridges," *Applied Physics Letters* 82(26), Jun. 30, 2003, pp. 4797-4799.
Meyyappan et al., Carbon nanotube growth by PECVD: a review, *Plasma Sources Sci. Technol.* 12(2003), pp. 205-216.

* cited by examiner

*Primary Examiner*—A. Sefer
*Assistant Examiner*—Allen L Parker
(74) *Attorney, Agent, or Firm*—Marshall, Gerstein & Borun LLP

(57) ABSTRACT

State-of-the-art synthesis of carbon nanostructures (25) by chemical vapor deposition involve heating a catalyst material to high temperatures up 700-1000° C. in a furnace and flowing hydrocarbon gases through the reactor over a period of time. In order to enable a self assembly of nanostructures (25) on microchips (10) without damaging the microchip (10) by high temperatures the proposed manufacturing method comprises: A layer (1) contains indentations (3) on which nanostructures (25) are to be integrated and the indentations (3) are heated up by a current (I) conducted to the layer (1) via contact pads (2).

8 Claims, 3 Drawing Sheets

MANUFACTURING METHOD FOR THE INTEGRATION OF NANOSTRUCTURES INTO MICROCHIPS

Figure 1:
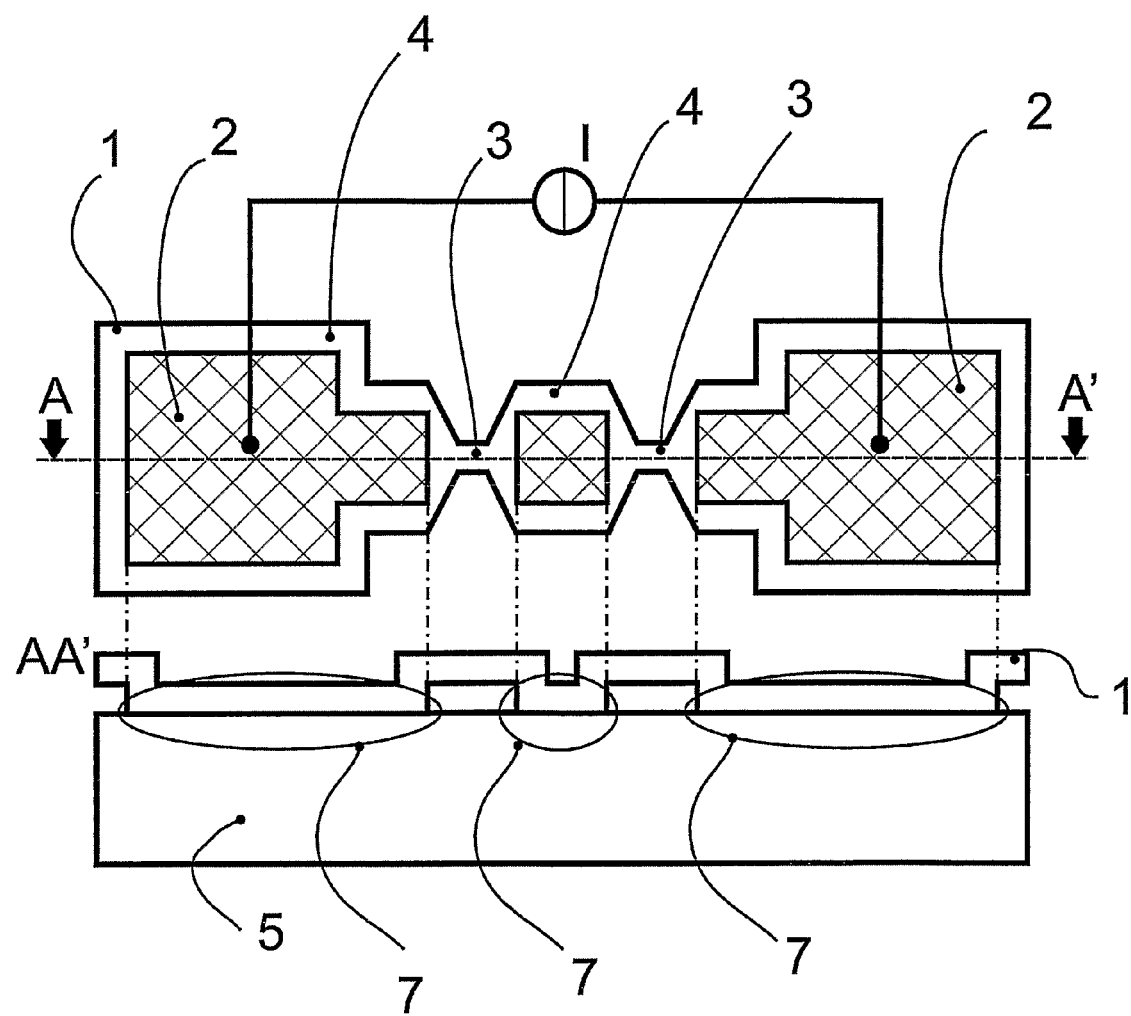

This invention relates to a manufacturing method for the integration of nanostructures into microchips according to the preamble of claim 1 as well as to microchips produced by the before mentioned fabrication method according to claim 7.

Carbon nanotubes are self-assembling nanostructures constructed of sheets of hexagonal-shaped carbon atoms rolled up into cylinders. Research work carried out in recent years has revealed the intriguing electrical and mechanical properties of these novel molecular scale wires. It is now established that carbon nanotubes have significant potential as building blocks for various practical nanoscale devices. As a matter of fact, they have been shown to be useful for miniaturized electronic, mechanical, electromechanical and chemical devices.

For the synthesis of carbon nanotubes three methods are known to date, they are arc-discharge, Laser ablation, Chemical vapor deposition CVD.

Arc-discharge and laser ablation methods have been actively pursued in the past 10 years. Both methods require graphitic targets which are heated to up to 2000° C. and produce a stack of randomly dispersed tubular carbon structures. The only candidate for the production of on-chip direct synthesis carbon nanotubes is the chemical vapor deposition CVD of hydrocarbon gases. State-of-the-art synthesis of carbon nanotubes by CVD involve heating a catalyst material to high temperatures (700-1000° C.) in a furnace and flowing hydrocarbon gases through the reactor over a period of time. The catalytic species are typically transition metal nanoparticles that are formed on a support material with large surface areas. The process involves the dissociation of hydrocarbon molecules catalysed by the transition metal, and dissolution and saturation of carbon atoms in the metal nanoparticle. The precipitation of carbon from the saturated metal particle leads to the formation of tubular carbon solids in a $sp^2$ structure. Not every catalytic site is producing an individual nanotube owing to a restricted growth yield. Furthermore the direction and shape of the tubular structure is random.

An important drawback for the state-of-the-art synthesis is the growth at elevated temperatures which prevents the integration into microelectronic chips.

As a reminder classic CVD requires heating of the furnace to 1000° C. Metal layers in microelectronic process like the well-established Complementary Metal-Oxide-Silicon (CMOS) process do not withstand such elevated temperatures.

Reference [1] discloses a resistive heating of microscale line shape resistors to activate vapor deposition synthesis of silicon nanowires and carbon nanotubes in a room-temperature chamber. The process is compatible with on-chip microelectronics and eliminates the necessity of postsynthesis assembly of nanostructures to form more complicated devices. The process is localized, selective, and scalable. The synthesized nanowire dimensions are 30-80 nm in diameter and up to 10 mm in length, while nanotubes 10-50 nm in diameter and up to 5 mm in length have been demonstrated. Growth rates of up to 1 mm/min for silicon nanowires and up to 0.25 mm/min for carbon nanotubes were observed. This method facilitates the integration of nanotechnology with larger-scale systems.

This heating according to reference [1] is scalable but does not prevent, that relatively large areas of a substrate are heated up to 1000° C. and therefore the disclosed heating is not applicable for an integration of nanostructures into microelectronic chips. Furthermore the technique according to reference [1] allows the production of only one single nanostructure at once.

The present invention therefore addresses the problem to avoid the above-mentioned drawbacks of the known syntheses, which is especially the known manufacturing method for the integration of nanostructures into microchips. Thus, there exists a need in industry to provide manufacturing methods for the integration of nanostructures into microchips without device failure or total chip/wafer damage.

This aim is reached by a manufacturing method for the integration of nanostructures into microchips specified in claim 1.

The proposed use of resistive heating of microstructures embedded in a microchip as the thermal energy provider for the growth of carbon nanotubes instead of global furnace heating prevents a global heating up of a chip. Current is passed through a freestanding indentation, e.g. a polysilicon beam, which only heats locally. The chip remains globally at room temperature and is thus CMOS technology compatible.

The proposed manufacturing method enables a self assembly of a plurality of nanostructures on microchips without damaging the microchip by high temperatures. By the method according to the invention a significant higher density of nanostructures is obtainable.

Figure 2:
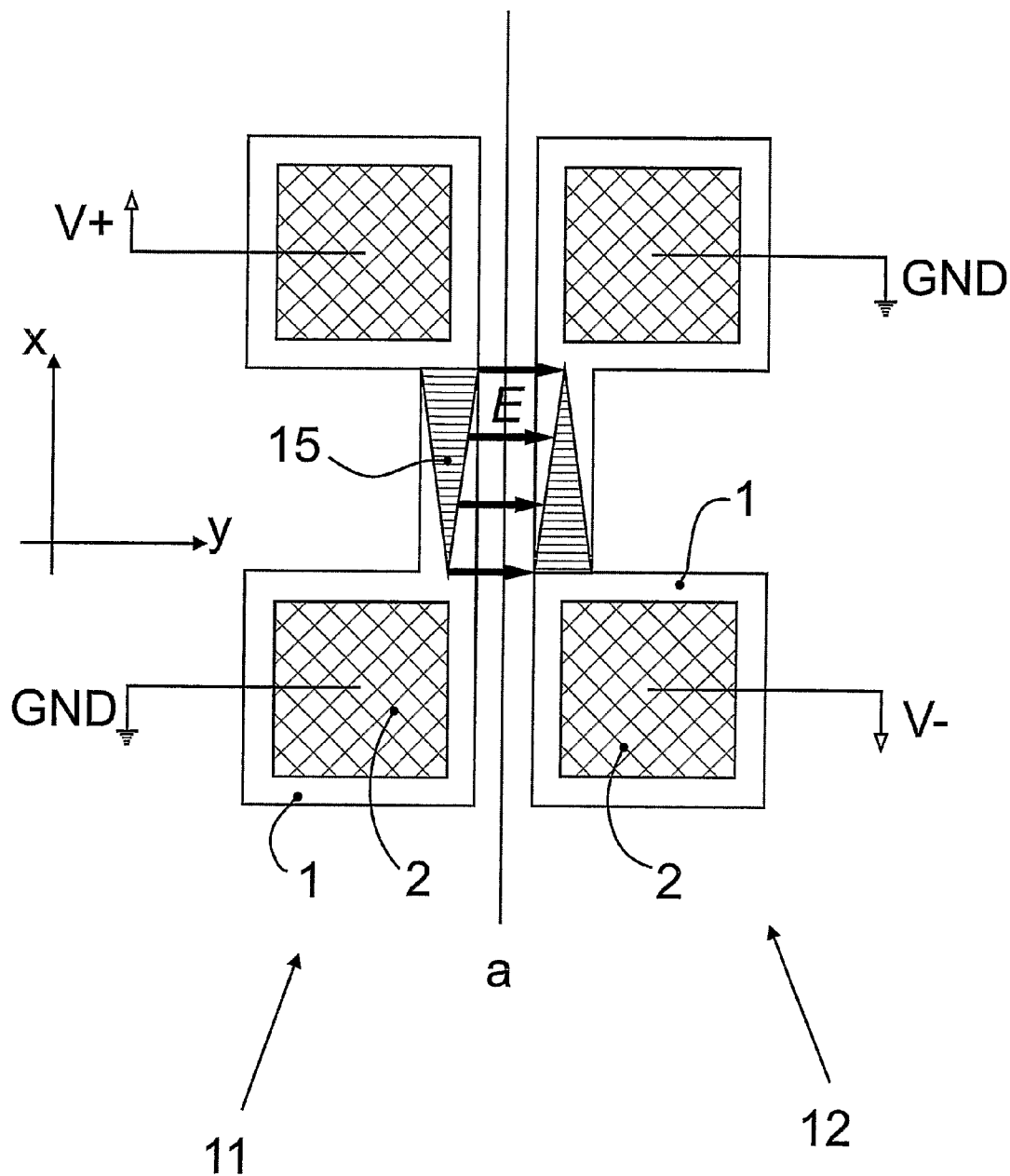
Figure 3:
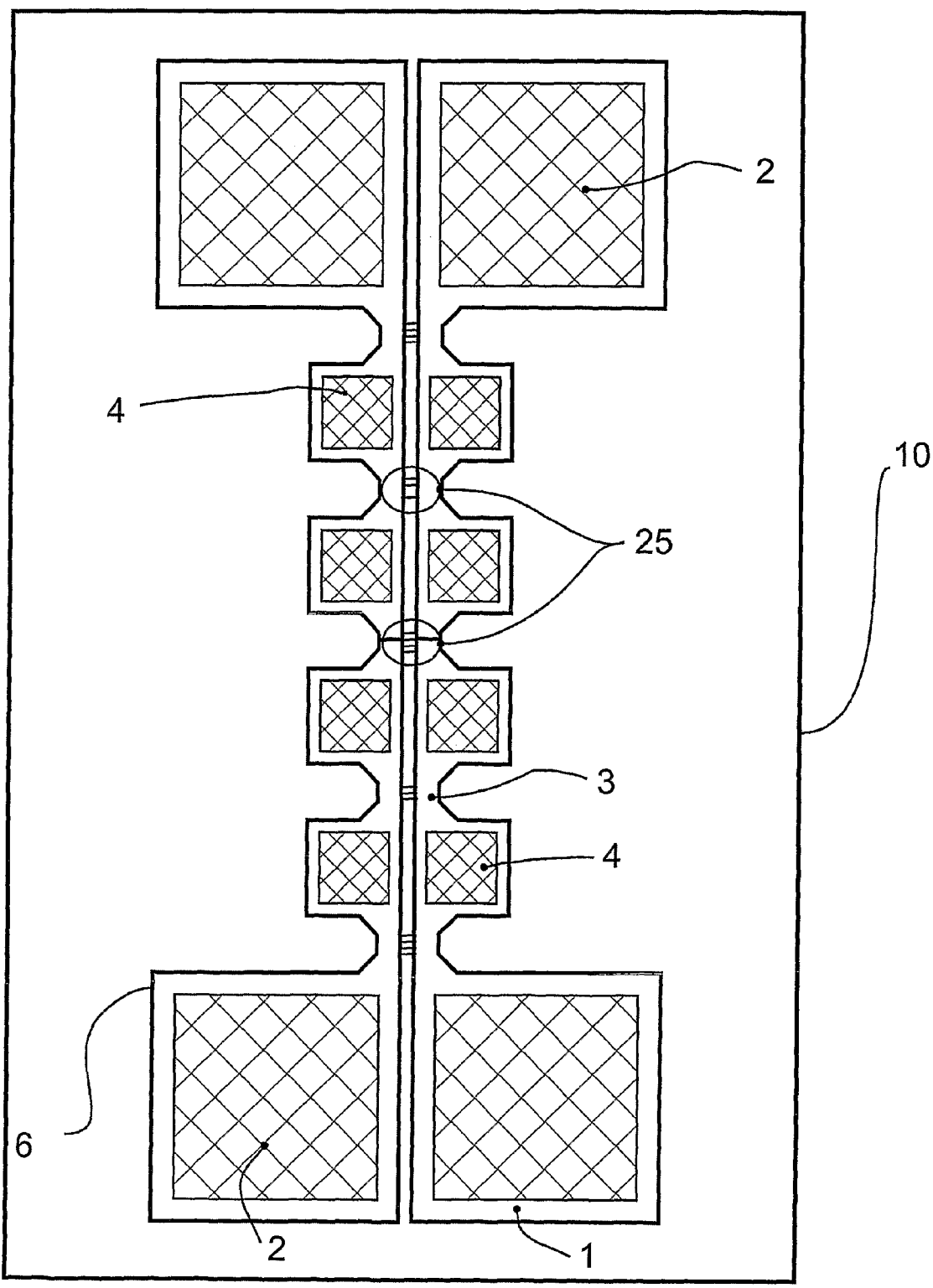

The invention will now be described in preferred embodiments with reference to the accompanying drawings wherein:

FIG. 1 top view and cross section along a line A-A of a heater system;

FIG. 2 generation of a uniform electrical field for a directed and aligned growth of nanostructures and FIG. 3 microchip structure for the integration of nanostructures.

FIG. 1 depicts a schematic view of heater system featuring two narrow heater spots 3 and three anchors 7 serving as heat sinks. The large areas 2 on the left/rightmost represent electrical contact pads. This heater system is part of a microchip structure 10, on which nanostructures 25 are to be integrated by a synthesis process comprising chemical vapor deposition of hydrocarbon gases in a heated environment, further details see FIG. 3. The heated area is formed by indentations 3 serving as heater spots 3 on a polysilicon layer 1. A current I is applied through contact pads 2. Due to a smaller cross section area at the indentations 3 there is a higher local electrical resistance and this indentation 3 is therefore locally heated by the current I. The polysilicon layer is mechanically and thermally connected with the substrate 5. These connections serve as heat sinks 7 in order to avoid a heating beyond the narrow hot pots of the polysilicon layer 1.

The thermal energy $\sim I^2 R$ generated in a resistive heater is proportional to the square current density. Local narrowing of the heater beam thus allows the creation of localized heat spots. Growth of carbon nanotubes only occurs at the regions of maximal temperature. However if the heater bridge is completely freestanding only heat can be dissipated through the contact pads to the substrate. The usage of surface micromachining technology is suggested to locally anchor the heater beam to the substrate 5 which serves as an infinite heat sink and thus enhances the integration density of structures containing embedded carbon nanotubes 25. FIG. 1 shows a series of two narrowed beam regions that serve as heat spots 3 to enhance the position control of the self-assembled nanostructures 25. Adjacent anchors 7 increase the temperature gradient through the beam and enhance the integration density of nanostructures 25.

The microheater, that is a microchip 10 containing indentations 3, depicted in FIG. 1 has the characteristic of exhibiting a thermal constant on the order of 1 ms. A typical state-of-the-art CVD furnace heats up at a maximum rate of 100° C./min. The pseudo thermal constant for this furnace would thus be 10 min which is $6 \cdot 10^5$ times slower than the suggested structure and the corresponding method according to FIG. 1. Furthermore, the dissipated power in a typical microheater is ~50 mW. For a given process time of 5 min, the microheater according to FIG. 1 requires an energy of 15 J. A classic CVD furnace—assuming 1000 W power consumption—requires as much as $1.5 \cdot 10^6$ J including heating and cooling before and after the growth process.

Referring to FIG. 2: Under an electric field E one can direct the align of nanostructures owing to their highly anisotropic polarizability. In fact, under the application of an electric field E they acquire dipole moments pointing mainly along their axes, with the size of the dipole inversely proportional to the square of the minimum direct band gap. Nanostructures 25 grown in an uniform electrical fields come as straight lines parallel to the field lines. According to FIG. 2 two adjacent microheater structures are placed anti-symmetrically next to each other. As pointed out before narrowed beams result in larger current densities and thus exhibit a large potential drop. A mirrored beam exhibits an identical potential drop across its beam. When feeding the mirrored beam with an anti-symmetric voltage or current the combined system sees a constant potential difference between the two heater beams and thus induces a uniform electrical field between them. The electrical field E ascertains then the alignment of the nanostructure 25 during the growth process.

Assuming $V^+=+|V|$ and $V^-=-|V|$ the potential in the left-hand beam $V_i=V_i(x,y)$ with i=1 for the left-handed beam—structure 11—and i=2 for the right-handed beam—structure 12—. Let us assume that x,y is bound within the structure which is axis-symmetric with respect to y, we thus have $V_i=V_i(x)$. Let structure 12 be mirrored from structure 11 around axis the center line a, a is also called a line of symmetry. We get, $$V_1(x)=V_2(-x)=-V_2(x)$$

The potential difference ΔV between structures 11 and 12 all along x becomes, $$\Delta V=V_1-V_2=2 \cdot V_1=2 \cdot |V|$$

The electrical field lines resulting from the potential difference are uniform as $$\Delta V(x)=\text{const.}$$

In other words, the field strength is constant along the line a.

Furthermore the lines are perpendicular to the planes of the structures and form a parallel mesh between them. Nanostructures 25 will grow and align in the described vicinity.

An overall implementation of the invention with a layer 1 comprising indentations 3 is depicted in FIG. 3: A in-line sequence of indentations 3 are arranged between two anchors 7 all being a part of the layer 1 form the structure of the microchip 10.

The polysilicon layer may be provided with additional layers of catalytic materials as disclosed in reference [1], e.g. transition metals.

LIST OF REFERENCE NUMERALS AND SYMBOLS

1 Structural layer, polysilicon layer
2 electrical contact pad, electrical ground pad
3 narrow <<hot>> spot; indentation
4 wide <<cold>> spot
5 substrate
6 microstructure, device featuring embedded nanostructures
7 heat sinks, mechanical connection between structural layer and substrate
10 microchip; microchip structure
11 left handed beam structure
12 right handed beam structure
15 potential drop
25 nanostructures
a line of symmetry
E electrical field
GND ground
I current
$sp^2$ hybridisation of carbon, as observe in graphite
V, V+, V− voltage

List Of Cited Documents

[1] <<Local synthesis of silicon nanowires and carbon nanotubes on microbridges>>
Ongi Englander, Dane Christensen, and Liwei Lin APPLIED PHYSICS LETTERS; VOLUME 82, NUMBER 26, 30 Jun. 2003; p. 4797-4799;

The invention claimed is:

1. A manufacturing method for the integration of nanostructures into a microchip structure, said method comprising:
providing said microchip structure with a structural layer on a substrate;
wherein said structural layer comprises
anchors connected to the substrate and
a sequence of freestanding indentations between said anchors,
wherein each freestanding indentation is placed between two anchors in order for the anchors to dissipate heat from the freestanding indentations,
wherein said freestanding indentations and said anchors form a current path through said structural layer, and
wherein, in said current path, said freestanding indentations are electrically arranged in series;
heating said freestanding indentations by a current flowing through the current path via contact pads; and
using resistive heating by said current for growing said nanostructures on said freestanding indentations on the structural layer by a synthesis method consisting of chemical vapor deposition of hydrocarbon gases in a heated environment.

2. The manufacturing method according to claim 1, wherein the microchip structure is divided into two axis symmetry and into electrically insulated substructures each comprising two contact pads which are oppositely connected with a voltage or current source in order to obtain an electrical field with parallel field lines and constant field strength for an aligned growth of the nanostructures.

3. The manufacturing method according to claim 1, wherein the structural layer is a polysilicon layer.

4. The manufacturing method according to claim 3, wherein the polysilicon layer is provided with additional layers of catalytic materials.

5. Microchip structure with nanostructures manufactured by the method according to claim 1.

6. The manufacturing method of claim 1 wherein said structural layer contains first and second anchors, wherein the first anchors are larger than the second anchors and are arranged at opposite ends of said sequence of indentations, and wherein said first anchors are used as said contact pads.

7. The manufacturing method of claim 1 wherein said structural layer contains first and second anchors, wherein the first anchors are larger than the second anchors and are arranged at opposite ends of said sequence of freestanding indentations, and wherein said first anchors are used as said contact pads.

8. A microchip structure comprising
a substrate and
a structural layer arranged on said substrate;
wherein said structural layer comprises
- a plurality of first and second anchors connected to said substrate, wherein the first anchors are larger than the second anchors, and
- a sequence of freestanding indentations, wherein each freestanding indentation is located between two anchors in order for the anchors to dissipate heat from the freestanding indentations when a current is sent via said first anchors through said sequence of freestanding indentations, wherein said second anchors and said freestanding indentations together form a continuous path for said current between said first anchors, and wherein, in said current path, said freestanding indentation are arranged electrically in series, and wherein said microchip structure further comprises nanostructures grown on said freestanding indentations.

* * * * *